US007563684B2

(12) United States Patent
Pellizzer et al.

(10) Patent No.: US 7,563,684 B2
(45) Date of Patent: Jul. 21, 2009

(54) PROCESS FOR MANUFACTURING AN ARRAY OF CELLS INCLUDING SELECTION BIPOLAR JUNCTION TRANSISTORS

(76) Inventors: Fabio Pellizzer, Via Peroz, 12, Follina (IT) 31051; Giulio Casagrande, Via Pietro Sala, 11, Vignate (IT) 20060; Roberto Gastaldi, Via Verdi, 38, Agrate Brianza (IT) 20041; Loris Vendrame, Via Grande, 73, Carbonera (IT) 31030; Augusto Benvenuti, Via S. Bernardino, 42, Lallio (IT) 24040; Tyler Lowrey, 2956 Waterview Dr., Rochester Hills, MI (US) 48304

( * ) Notice: Subject to any disclaimer, the term of this patent is extended or adjusted under 35 U.S.C. 154(b) by 355 days.

(21) Appl. No.: 11/264,084

(22) Filed: Nov. 1, 2005

(65) Prior Publication Data

US 2006/0049392 A1 Mar. 9, 2006

Related U.S. Application Data

(62) Division of application No. 10/680,721, filed on Oct. 7, 2003, now Pat. No. 6,989,580.

(30) Foreign Application Priority Data

Oct. 8, 2002 (EP) .................................. 02425604

(51) Int. Cl.
*H01L 21/8226* (2006.01)
(52) U.S. Cl. .............................. 438/326; 257/E27.075; 257/577; 438/324; 438/341
(58) Field of Classification Search ................. 257/2–5, 257/530, 577, E27.075–E27.078, E45.002, 257/E21.613, E21.654, 593; 438/900, 514, 438/202, 329, 326, 324, 341
See application file for complete search history.

(56) References Cited

U.S. PATENT DOCUMENTS

| 4,180,866 A | 12/1979 | Shanks ........................ 365/186 |
| 4,981,807 A | 1/1991 | Jambotkar .................... 437/31 |
| 5,262,670 A | 11/1993 | Lee et al. ..................... 257/577 |
| 5,276,638 A | 1/1994 | Wong .......................... 365/156 |
| 5,677,209 A * | 10/1997 | Shon et al. ................... 438/363 |
| 5,789,758 A | 8/1998 | Reinberg ........................ 257/3 |
| 6,369,431 B1 * | 4/2002 | Gonzalez et al. ............. 257/390 |

(Continued)

*Primary Examiner*—Allan R. Wilson
(74) *Attorney, Agent, or Firm*—Blakely, Sokoloff, Taylor & Zafman LLP

(57) ABSTRACT

A process for manufacturing an array of cells, including: implanting, in a body of semiconductor material of a first conductivity type, a common conduction region of the first conductivity type; forming, in the body, above the common conduction region, a plurality of active area regions of a second conductivity type and a first doping level; forming, on top of the body, an insulating layer having first and second openings; implanting first portions of the active area regions through the first openings with a doping agent of the first conductivity type, thereby forming, in the active area regions, second conduction regions of the first conductivity type; implanting second portions of the active area regions through the second openings with a doping agent of the second conductivity type, thereby forming control contact regions of the second conductivity type and a second doping level, higher than the first doping level; forming, on top of the body, a plurality of storage components, each storage component having a terminal connected to a respective second conduction region.

23 Claims, 7 Drawing Sheets

U.S. PATENT DOCUMENTS

| | | | |
|---|---|---|---|
| 6,403,436 B1 | 6/2002 | Tanomura | 438/312 |
| 6,434,041 B2 | 8/2002 | Forbes | 365/177 |
| 6,437,383 B1 | 8/2002 | Xu | 257/300 |
| 6,531,373 B2 | 3/2003 | Gill et al. | 438/400 |
| 6,534,781 B2 | 3/2003 | Dennison | 257/5 |
| 6,573,586 B2 | 6/2003 | Sakata et al. | 257/529 |
| 6,649,928 B2 | 11/2003 | Dennison | 257/4 |
| 6,838,723 B2 | 1/2005 | Forbes | 257/301 |
| 2004/0150093 A1 | 8/2004 | Pellizzer et al. | 257/695 |

\* cited by examiner

PROCESS FOR MANUFACTURING AN ARRAY OF CELLS INCLUDING SELECTION BIPOLAR JUNCTION TRANSISTORS

BACKGROUND OF THE INVENTION

1. Field of the Invention

The present invention relates to a process for manufacturing an array of cells including selection bipolar junction transistors. In particular, the invention refers to a memory array of a phase change memory (PCM) device, without being limited thereto.

2. Description of the Related Art

As is known, phase change memory cells utilize a class of materials that have the unique property of being reversibly switchable from one phase to another with measurable distinct resistivity. Specific materials that may be suitably used in phase change memory cells are alloys of elements of the VI group of the periodic table as Te or Se, also called chalcogenides or chalcogenic materials. Thus a thin film of chalcogenic material may be employed as a programmable resistor, switching between a high and a low resistance condition.

The use of chalcogenic storage elements has been already proposed to form a memory cell. To avoid disturbances caused by adjacent memory cells, the chalcogenic element is generally coupled with a selection element, generally a MOS transistor or a diode.

A possible organization of a PCM array is shown in FIG. 1. The memory array 1 of FIG. 1 comprises a plurality of memory cells 2, each including a storage element 3 of the phase change type and a selection element 4 formed here as a diode.

The memory cells 2 are arranged on rows and columns. In each memory cell 2, the storage element 3 has a first terminal connected to an own bit line BLn−1, BLn, BLn+1, . . . , and a second terminal connected to an anode of the diode 4; the diode 4 has a cathode connected to an own word line WLn−1, WLn, WLn+1, . . . .

In order to address the storage element 3 belonging to a specific cell 2, for example the one connected to bit line BLn and to world line WLn, the bit line connected to the addressed cell (selected bit line BLn) is biased at a high voltage $V_{OP}$ and all the other (unselected) bit lines BLn−1, BLn+1, . . . are grounded. Furthermore, the word line connected to the addressed cell (selected word line WLn) is grounded and all the other (unselected) word lines WLn−1, WLn+1, . . . are biased at $V_{CC}$, so that only the diode 4 connected to the selected word line and bit line is on.

CMOS compatible processes for manufacturing PCM have been already proposed, wherein the diodes are integrated in a P-type substrate wherein N-type regions are formed. The N-type regions, defining the cathode of the diodes, are contacted by a metal line and form wordlines of the array. The N-type regions accommodate P-type regions that define the anodes of the diodes and are connected to long stripes of chalcogenic material at small portions thereof defining the storage elements. The stripes of chalcogenic material extend perpendicular to the wordlines and define bitlines of the array.

Because of this structure, the diodes are associated with parasitic bipolar transistors having emitters formed by the diode anodes and connected to the bitlines (here, bitline BLn); bases formed by the diode cathodes and connected to the wordlines (here, wordline WLn); and collectors formed by the substrate. The equivalent electric diagram of a real cell is shown of FIG. 2.

In practice, selection of a cell 2 is done by driving the bipolar transistor 4 in the active region and biasing the base-emitter junction in direct mode. Therefore, the actual current $I_B$ supplied by the base terminal is not equal to the current $I_E$ flowing through the emitter terminal, but is defined by the following relationship:

$$I_B = I_E/(1+\beta_F)$$

wherein $\beta_F$ is the current gain of the bipolar transistor.

The presence of these parasitic transistors causes some problems, mainly due to the high currents flowing in particular during a modify (set, reset) operation. Indeed, usually a write operation is performed on a number of cells on a single wordline (eight or sixteen cells, or even more) so that the total current flowing through the selected wordline and in the decoder drive pull-down transistor is the sum of the currents of the cells. This poses an upper limit to the number of cells that can be modified in a single operation, because the voltage drop across the selected wordline and the pull-down transistor becomes unacceptable.

Indeed, during a modify operation, a current in the range of 200 μA flows through the emitter terminal of each bipolar transistor 4. Since, as said, eight or sixteen cells connected to a same wordline are modified at the same time, the total current entering the emitters of the selected transistors is 1.6-3.2 mA.

Since in known memory arrays the bipolar transistor is not exploited, but instead it is considered a parasitic element, its design is not optimized, so that its current gain $\beta_F$ is much less than 1, the current flowing in the selected wordline is about the same as the total emitter current (1.6-3.2 mA, as above discussed); this current flows along the entire wordline and in the pull-down transistor of the row decoder, causing an unacceptable voltage drop.

BRIEF SUMMARY OF THE INVENTION

An embodiment of this invention provides a manufacturing method allowing integration of a bipolar transistor in a cell array so as to overcome the above-indicated drawbacks.

According to one aspect of the invention, the bipolar transistor operating as a selection element of an array of memory cells is formed in a semiconductor body including some distinct regions: a substrate of P-type; a subcollector region, of P-type, overlying the substrate; a collector region of P-type, overlying the subcollector region; a base region, of N-type, overlying the collector region; an emitter region, of P-type, housed in the base region; and a base contact. The emitter region and the base contact are contacted through contacts formed in a dielectric layer grown over the semiconductor body and are implanted after depositing the dielectric layer, or at least a lower portion thereof and opening the contacts, using an own mask. Thereby no misalignment of the emitter and base contact masks may cause short-circuits between the emitter and base contact regions.

According to another aspect of the invention, the doping of each of the regions forming the bipolar transistors is optimized as regards driving capability, leakage immunity, and low voltage requirement.

BRIEF DESCRIPTION OF THE SEVERAL VIEWS OF THE DRAWINGS

For the understanding of the present invention, preferred embodiments are now described, purely as a non-limitative examples, with reference to the enclosed drawings, wherein.

DETAILED DESCRIPTION OF THE INVENTION

A simple solution to the unacceptable voltage drop in prior art PCM memory devices is that to divide the wordlines, introducing four or eight local drivers driving two bits as a maximum.

However, this solution increases the complexity of the memory device, the required area and thus the unitary costs of the memory device.

Another solution of the above problem resides in maximizing the current gain $\beta_F$, so as to minimize the current flowing in the selected wordline and the pull-down transistor; thereby reducing the dimensions of the local driver or conversely the number of the local drivers to two or four, each local driver driving four bits.

However, the manufacture of a bipolar transistor as a selection element in a memory array with low current gain implies some problems. First of all, the process should be such as to avoid any possible shorting of the emitters and the base contacts in case of misalignments, even when the cell pitch is particularly tight.

Furthermore, a high current gain requires a very low base doping, leading to a high base resistance. Since the base is also the wordline of the array, both delay time and voltage drop along the wordline would be increased. Not least, a high current flowing into the substrate can give rise to injection problems that must be carefully handled. All these problems require an accurate optimization of the manufacturing process and a tradeoff between conflicting requirements.

Figure 3:
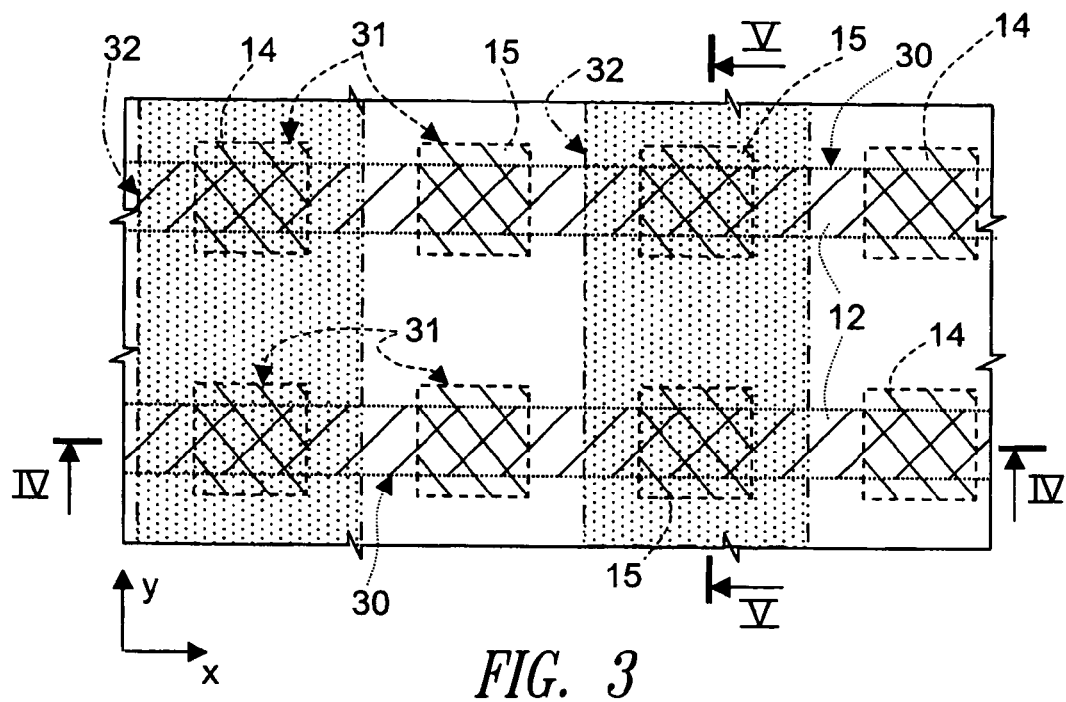
FIG. 3 shows the masks used for manufacturing a bipolar transistor according to a first embodiment of the invention.
Figure 4:
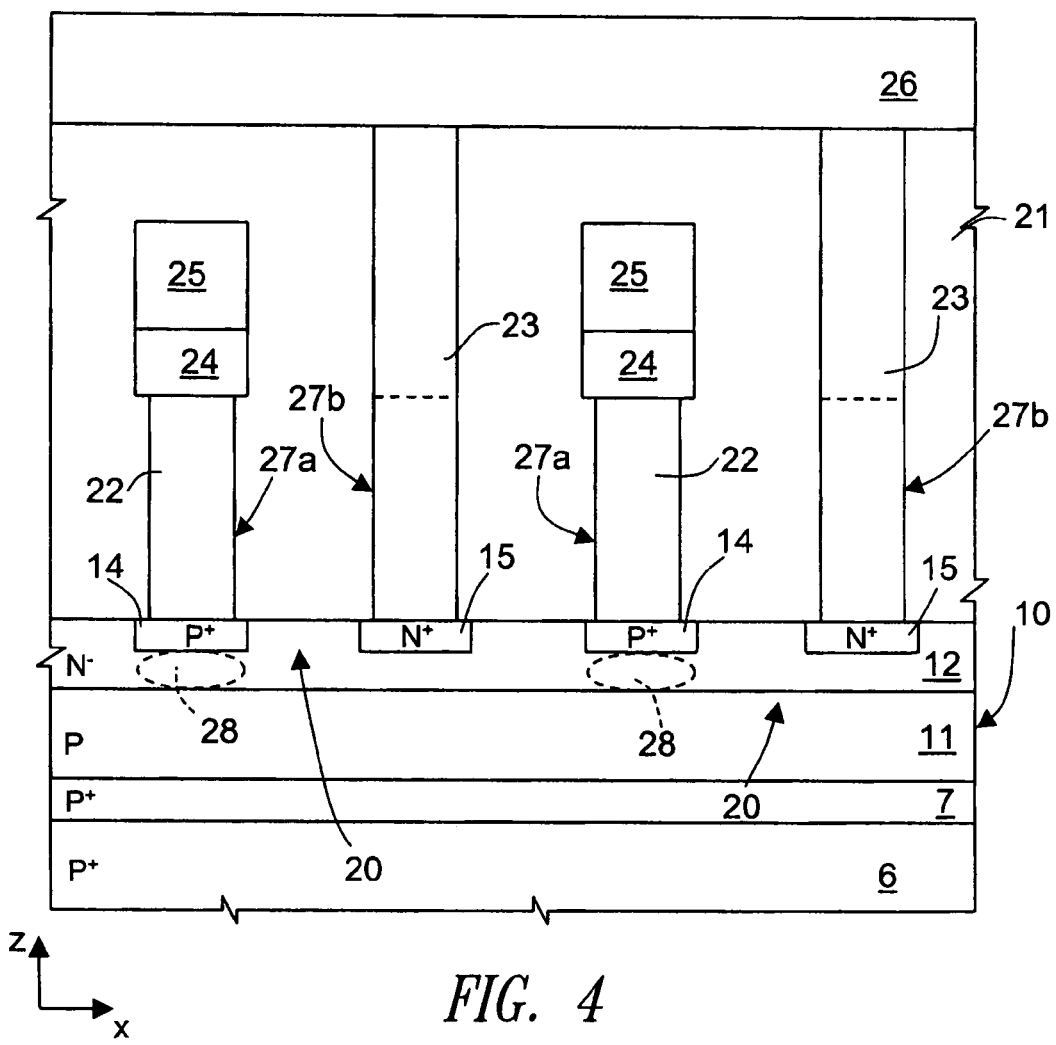
FIG. 4 shows a cross-section of the first embodiment, taken along line IV-IV of FIG. 3.
Figure 5:
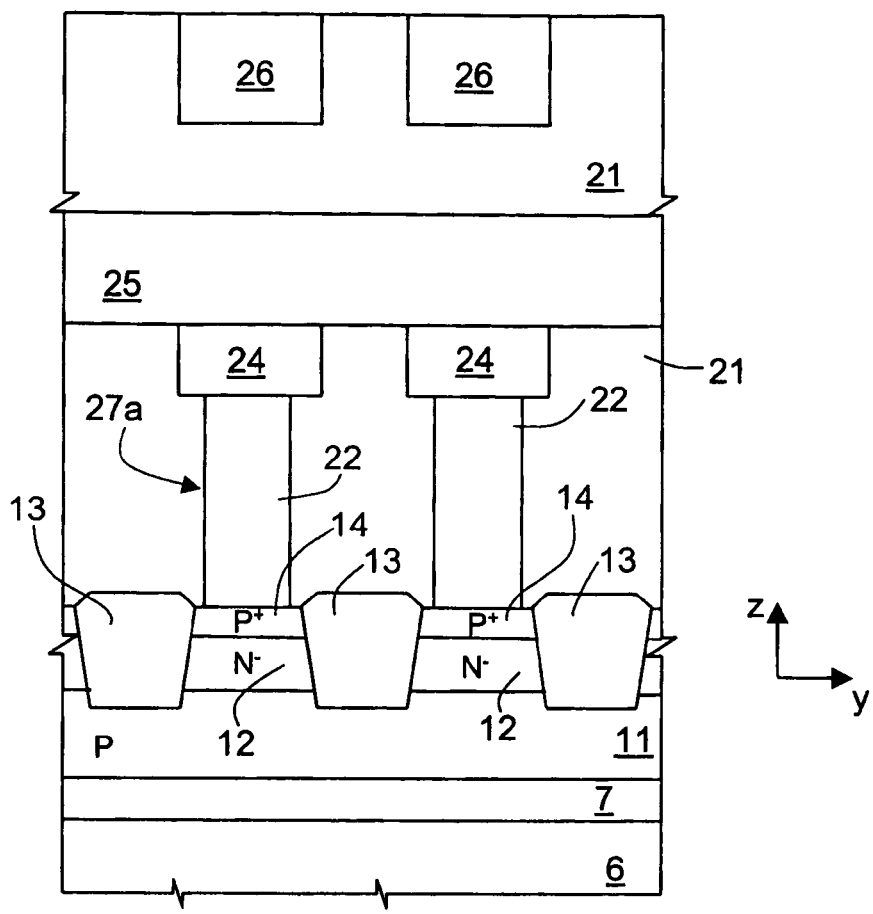
FIG. 5 shows a cross-section of the first embodiment, taken along line V-V of FIG. 3.

According to the embodiment of FIGS. 3-5, a memory array is formed in a body 10 of semiconductor material including a heavily doped substrate 6 of P-type. A subcollector region 7, also of P-type and high doping level, extends above the substrate 6 in an epitaxial layer. A common collector region 11, of P-type and lower doping level than the subcollector region 7, extends on the substrate 6, also in the epitaxial layer. The epitaxial layer also houses a plurality of active area strips 12, of N-type, defining base regions. The active area strips 12 extend parallel to each other along a first direction (X-direction) and are electrically insulated from each other by field oxide regions 13 (FIG. 5).

Figure 2:
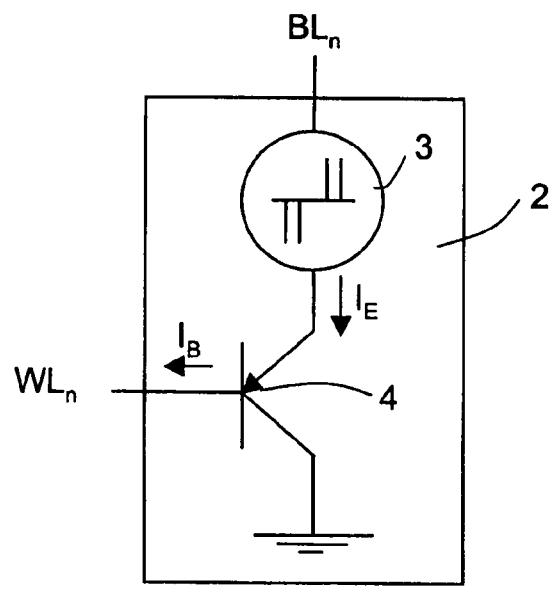
FIG. 2 shows an equivalent actual electric diagram of a memory cell of the array of FIG. 1.

Each active area strip 12 accommodates a plurality of emitter regions 14, of P$^+$-type, and a plurality of base contact regions 15, of N$^+$-type, that are arranged alternately, that is each emitter region 14 is arranged between two base contact regions 15, and each base contact region 15 is arranged between two emitter regions 14. Thus, each pair of regions including an emitter region 14 and the adjacent base contact region 15 (for example, an emitter region 14 and the base contact region 15 arranged on right thereof), the active area strip 12 they are accommodated in, and the underlying common collector region 11 form a selection transistor 20 of PNP-type, corresponding to bipolar transistor 4 of FIG. 2.

A dielectric region 21 extends on the body 10 and accommodates contacts, storage elements and interconnection lines. The dielectric region 21 is generally formed by more layers deposited subsequently to allow forming the various regions therein and may also include different materials.

First and second contacts 22, 23 extend in first and second openings 27a, 27b of the dielectric region 21. Preferably, the first and second contacts 22, 23 are of tungsten, covered on the vertical and bottom sides with a barrier material (for example, Ti/TiN), not shown for simplicity.

Figure 1:
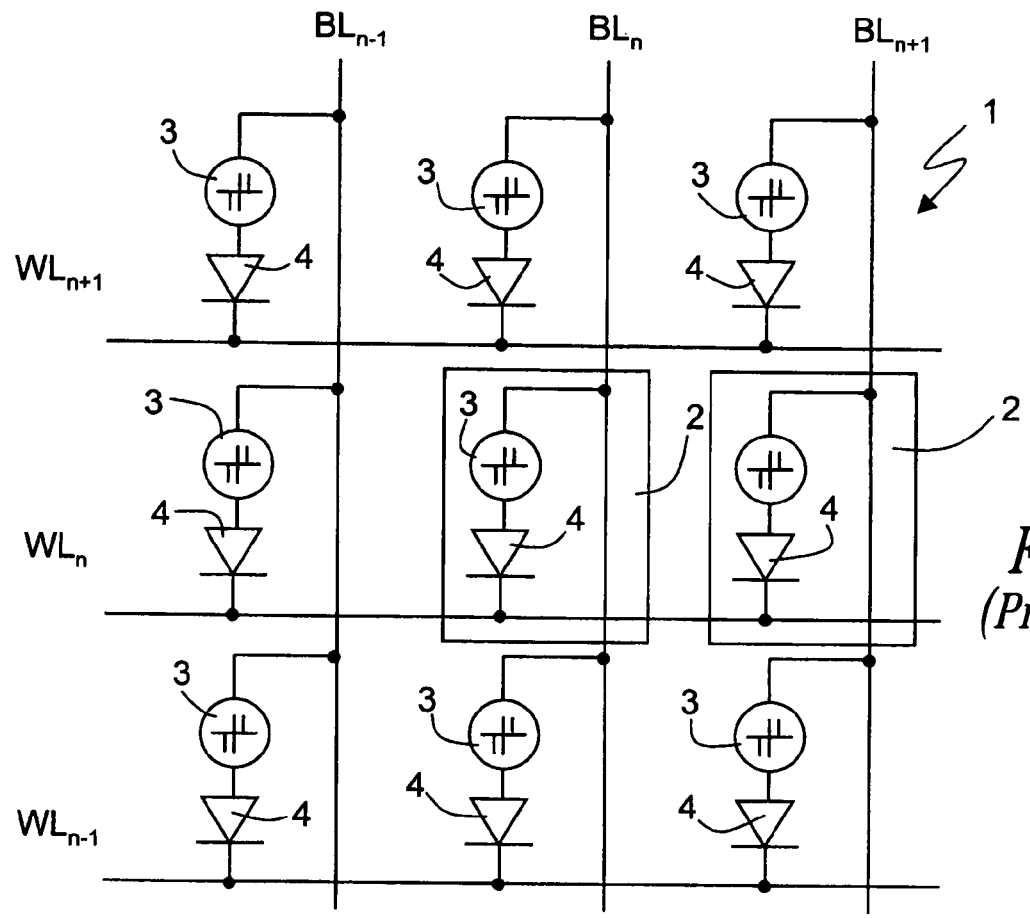
FIG. 1 illustrates a circuit diagram of a known array of phase change memory cells.

The first contacts 22 extend each from an emitter region 14 to a chalcogenic storage element 24 forming the storage element 3 of FIG. 1. First metal lines 25, forming bit lines corresponding to bit lines BLn−1, BLn, BLn+1 of FIG. 1, extend along a second direction (Y-direction), thus transversely to the active area strips 12. Each first metal line 25 is in contact with the chalcogenic storage elements 24 that are aligned in the Y direction, as visible from the cross-section of FIG. 5. The first metal lines 25 are formed preferably in a first metal level.

The second contacts 23 are higher than the first contacts 22 and extend each from a base contact region 15 to second metal lines 26. The second metal lines 26, forming word lines corresponding to word lines WLn−1, WLn, WLn+1 of FIG. 1, extend along the first direction (X-direction), thus parallel to the active area strips 12 and perpendicular to the first metal lines 25. Each second metal line 26 is in contact with the second contacts 23 that are aligned in the X direction, as visible from the cross-section of FIG. 4. The second metal lines 26 are formed preferably in a second metal level.

FIG. 3 shows some masks to be used for manufacturing the memory array of FIGS. 4 and 5. In particular, FIG. 3 shows an active area mask 30, a contact mask 31 and an emitter mask 32.

The process for manufacturing the memory array of FIGS. 4 and 5 is the following.

Figure 6:
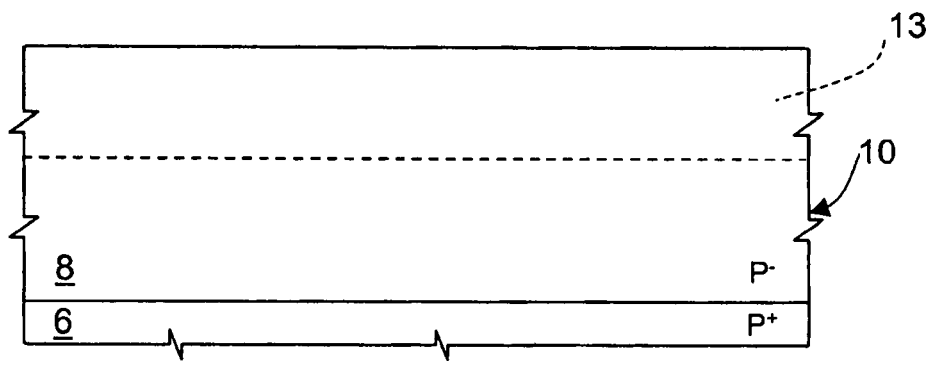
FIGS. 6-11 illustrate cross-sections taken along the same section plane of FIG. 4 through a portion of a semiconductor wafer in subsequent manufacturing steps of a bipolar transistor of the cell array according to the invention.

As shown in FIG. 6, the process starts from a semiconductor body or wafer 10 having a surface 10a and including a substrate 6 and an epitaxial layer 8, both of P-type, wherein the substrate 6 has a high doping (for example, higher than $10^{19}$ atoms/cm$^3$) and the epitaxial layer has a low doping (for example, about $10^{15}$ atoms/cm$^3$).

First of all, field oxide regions 13 (shown with dotted lines in FIG. 6 and visible from the cross-section of FIG. 9) are formed in a per se known manner in the epitaxial layer 8, using the active area mask 30 of FIG. 3, and thus laterally delimiting the active area strips 12.

Figure 7:
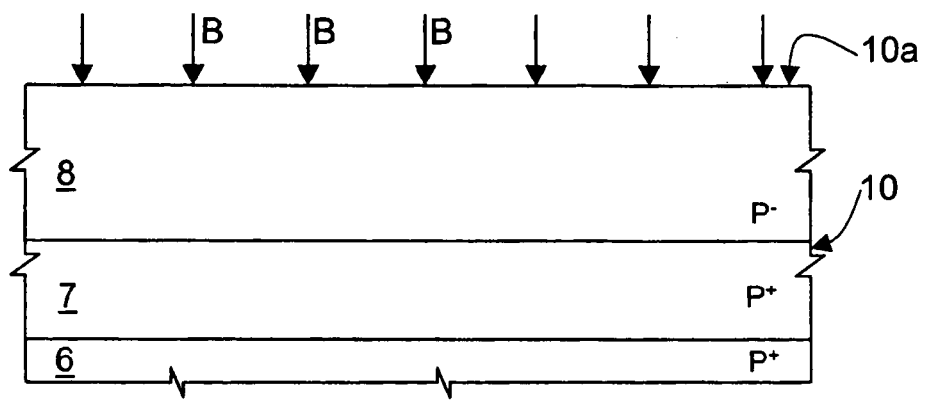
Figure 12:
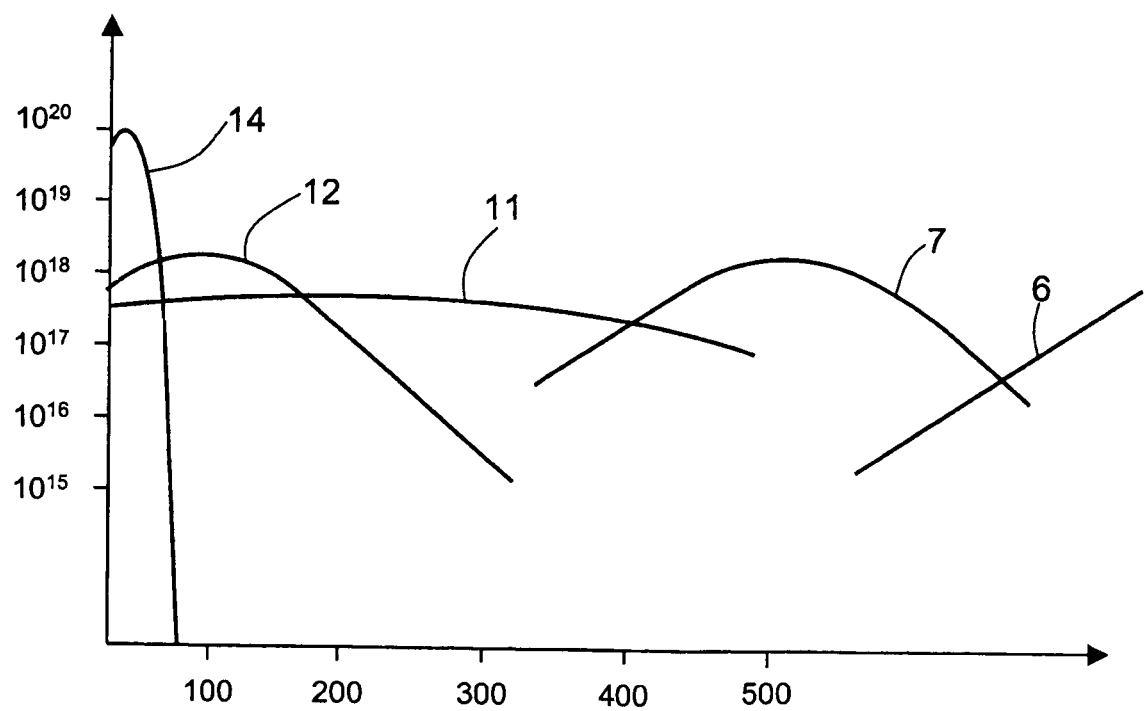
FIG. 12 shows the doping profile for the bipolar transistor of FIG. 4.

Then boron is implanted at high energy at a dose of $10^{13}$-$10^{14}$ atoms/cm$^2$ (FIG. 7) so that, at the end of annealing, the subcollector region 7 extends at a depth comprised between 400 and 850 nm from the surface 10a of the semiconductor body 10 and has a doping level comprised between $10^{17}$ and $10^{19}$ atoms/cm$^3$, with a peak at a depth of about 0.55 μm (see also FIG. 12). Thereby, a maximum resistance of about 500Ω and thus a maximum voltage drop of 100 mV (for a collector current of 200 μA during a reset pulse) are ensured.

After annealing, a P-well is implanted in the array part of the device, forming the common collector region 11, extending at a depth comprised between 200 and 400 nm from the surface 10a. Since the common collector region 11 should sustain a high current density and thus high level injection effects (e.g., Kirk effect) have to be carefully prevented, the doping level of the common collector region 11 is quite high, of the order of $10^{17}$-$10^{18}$, with a peak of about $10^{18}$ at a depth of about 0.25 μm.

Figure 8:
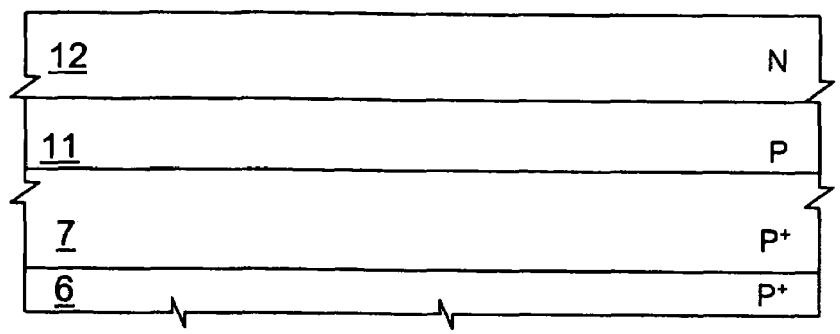
Figure 9:
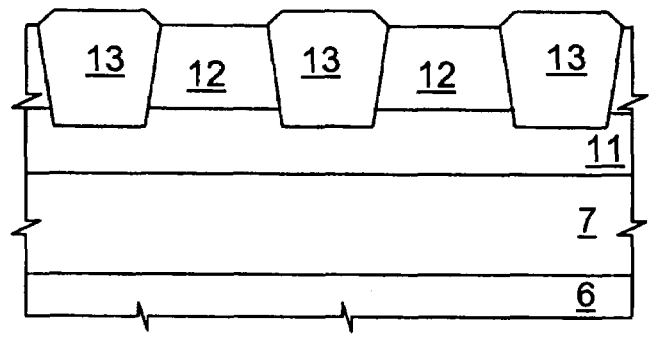

Thereafter, FIGS. 8, 9, the active area strips 12 are implanted with N-type doping agents, thus forming the base regions of bipolar transistors extending down from the surface 10a to about 170 nm. Conveniently, arsenic with an energy of 150-300 keV, preferably about 200 keV is implanted, so as to obtain a final doping level of between $5*10^{17}$ and $5*10^{18}$ atoms/cm$^3$. Thereby it is ensured that the base regions 12 have a shallower depth than the field oxide regions 13 and thus that there is an effective insulation between adjacent wordlines.

Furthermore, the base thickness and peak doping represent a good tradeoff between two conflicting requirements: on one hand, they should be low, so as to achieve a low base Gummel number and thus a high gain; on the other hand, they should be high to avoid the risk of pinch-off when a positive voltage is applied to the wordline (to deselect it) and to reduce to a minimum any leakage of the collector-base and emitter-base junctions. Moreover, the use of arsenic as a doping agent and the selected energy further insure a very sharp doping profile, thereby reducing the risk of pinch off while keeping the base-collector junction as shallow as possible (in particular it has to be shallower than the field oxide isolation).

Figure 10:
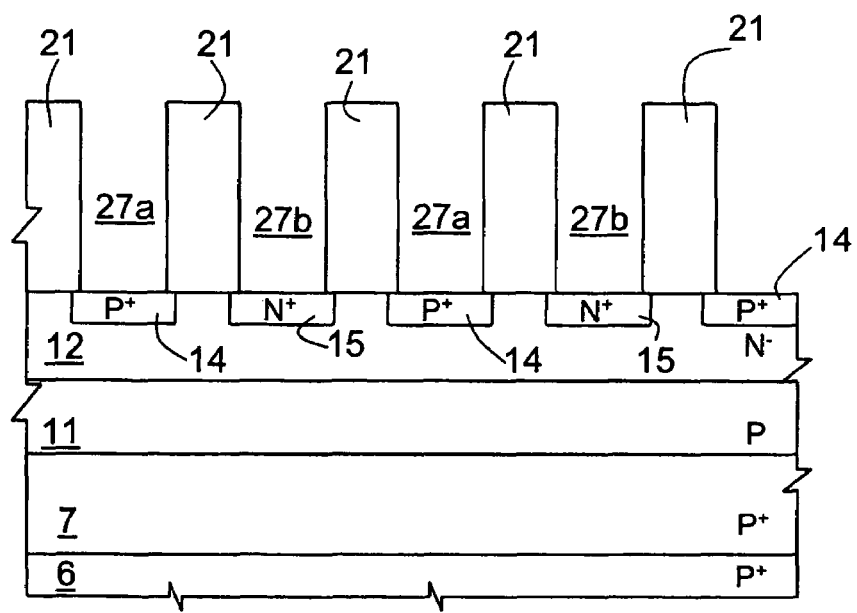

Thereafter, FIG. 10, the body 10 is covered by a first layer of insulating material, forming the bottom portion of the dielectric region 21, and contacts are opened using contact mask 31 of FIG. 3, thereby forming the first openings 27a and the bottom portion of the second openings 27b. Then, a boron implant (P$^+$-emitter implant) is made, using emitter mask 32, so as to form emitter regions 14 with a doping level of about $10^{19}$-$10^{20}$ atoms/cm$^3$ below the first contacts 22. The emitter implant is studied so as to keep the emitter regions 14 as shallow and as abrupt as possible (preferably, the emitter regions 14 have a depth of about 50 nm). Thus, $BF_2$ is selected for the implant, thereby reducing channeling (through amorphization) and ensuring a shallow implant without using a very low energy implant ($^{11}$B at energy in the range of 1 KeV).

Thereafter, using an own mask not shown, that is the negative of the emitter mask 32, base contact regions 15 are implanted below the second contacts 23 using arsenic (or even phosphorus). In case, the base contact regions 15 may be doped before the emitter regions 14.

The obtained doping profile of the various regions is shown in FIG. 12.

Figure 11:
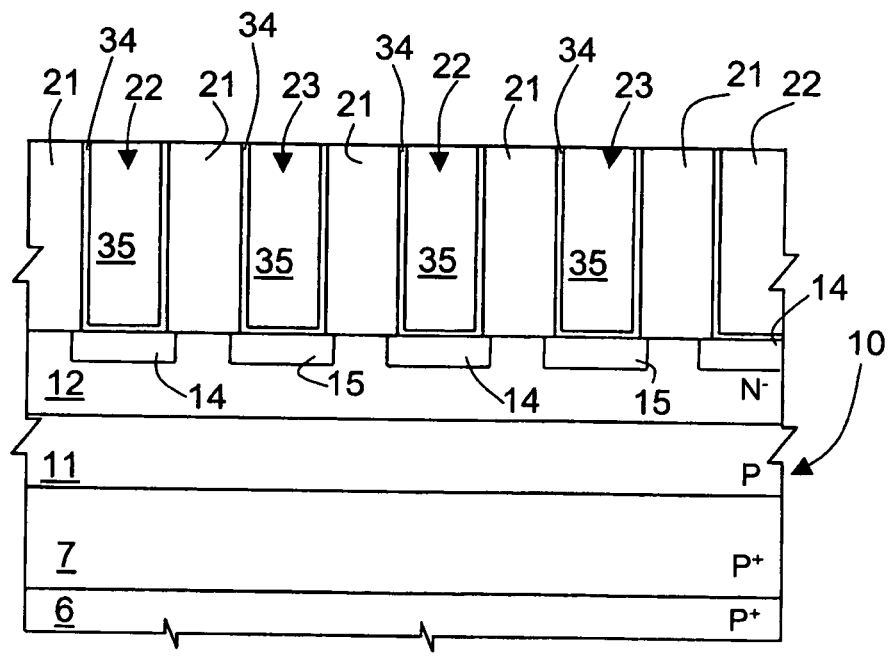

Then, FIG. 11, the first openings 27a and the bottom part of the second openings 27b are filled with a barrier layer 34, e.g., Ti/TiN, and with tungsten 35.

The process continues with the necessary steps to form the memory elements, including forming the chalcogenic storage elements 24, the first metal lines 25, the second metal lines 26, the upper portion of the dielectric region 21 and the upper portion of the second contacts 23, e.g., as described in U.S. patent application Ser. No. 10/313,991, filed on Dec. 5, 2002 and entitled Small Area Contact Region, High Efficiency Phase Change Memory Cell and Fabrication Method Thereof, which is incorporated by reference herein in its entirety, to obtain the structure shown in FIGS. 4 and 5.

Alternatively, instead of the chalcogenic storage elements 24, other storage elements or other two- or three-terminal elements that are compatible with standard CMOS back-end processes may be formed.

According to a different embodiment, a doped region 28 of N type, having a higher doping level than the active area strips 12, is formed below each emitter region 14, as shown by broken lines in FIG. 4. In this case, an N conductivity type determining agent, e.g., arsenic, is implanted using a dose close to that used for the active area strips 12 and employing the emitter mask 32, just after or just before the P$^+$ emitter implant. Thereby, the base resistance and thus the emitter-to-base voltage drop are reduced, increasing also the immunity of the bipolar transistor against emitter-to-collector leakage and punch-through.

Figure 13:
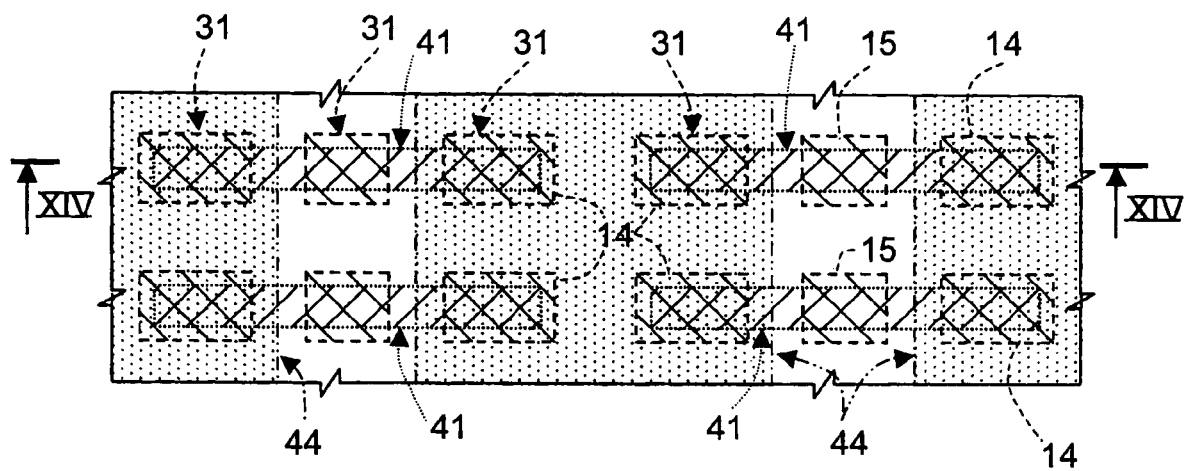
FIG. 13 shows the masks used for manufacturing a bipolar transistor according to a second embodiment of the invention.
Figure 14:
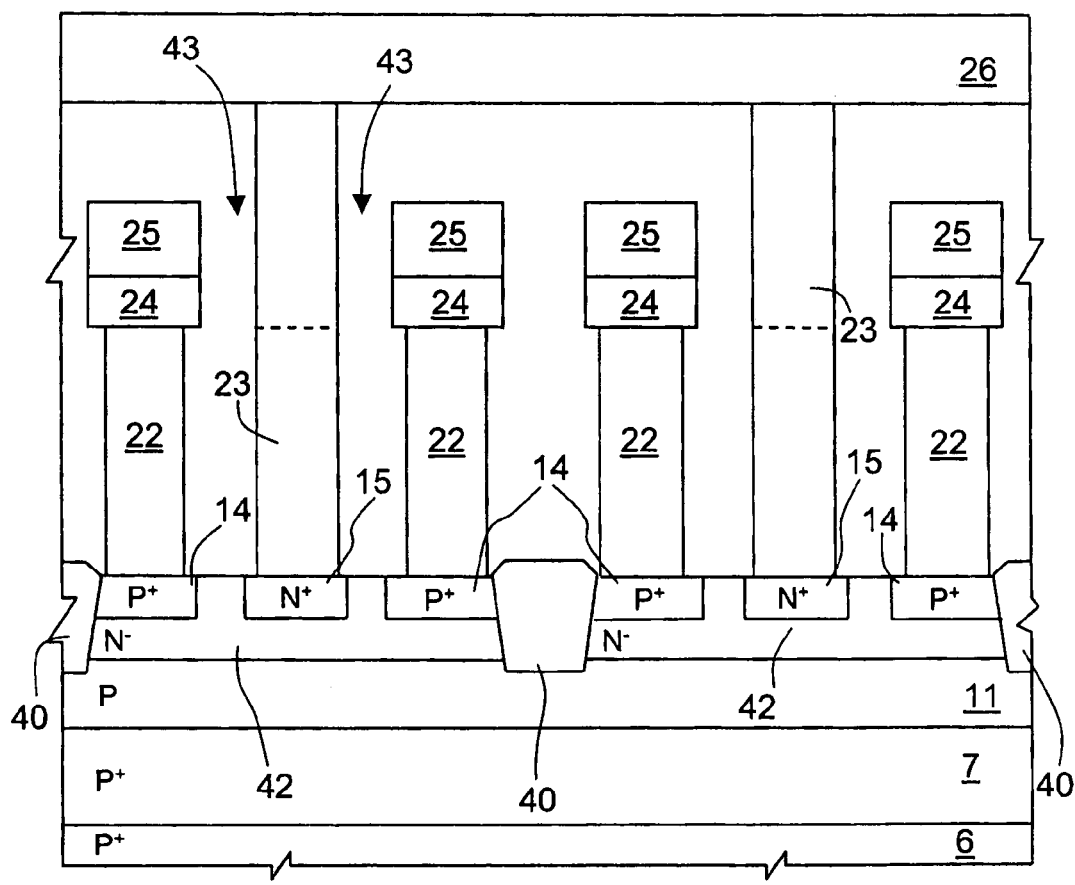
FIG. 14 is a cross-section of the second embodiment, taken along line XIV-XIV of FIG. 13.

FIGS. 13, 14 show a different layout for a memory array having a selection element formed as a high-gain transistor, as above discussed. Here, in the X-direction, each emitter region 14 is separated by the adjacent emitter regions 14 by a base contact region 15 on one side (left in the drawings), and by a field oxide region 40 on the other side (right in the drawings). As shown, the active area mask 41 (FIG. 13) has an grid-like pattern, and a field oxide region 40, having a grid-like shape, delimits a plurality of active regions 42 of rectangular shape. Each active region 42 accommodates only one base contact region 15 and two emitter regions 40, arranged on different sides of the base contact region 15 in the X-direction. Thus, each active region 42 accommodates two bipolar transistors 43 that share a same base contact region 15.

The cross-section in a plane perpendicular to that of FIG. 14 is the same as in FIG. 5.

As visible from FIG. 13, the shape of the active area mask 41 and that of the emitter mask 44 differ from the active area mask 30 and the emitter mask 32 of FIG. 3; however, contact mask 31 is about the same as in FIG. 3.

The manufacturing process, the doping levels and energies of the memory array of FIGS. 13 and 14 are the same described above with reference to FIGS. 3-12, with the only exception of the shape of the active area mask 41 and the emitter mask 44, as above outlined.

Also in the embodiment of FIGS. 13 and 14 a N-doped region 28 (not shown) may be provided below the emitter region 14, to reduce the base resistance and improve punch-through immunity.

With the embodiment of FIGS. 13 and 14, it is possible to save around 20% of silicon area with respect to the embodiment of FIGS. 3-5, even if the active area corners could introduce defectiveness issues.

Figure 15:
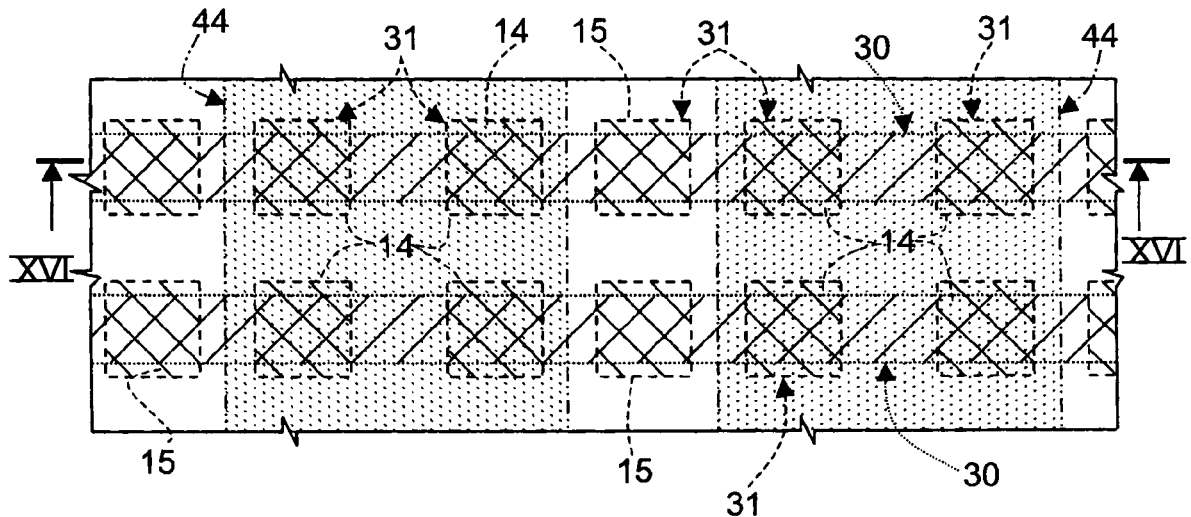
FIG. 15 shows the masks used for manufacturing a bipolar transistor according to a third embodiment of the invention.
Figure 16:
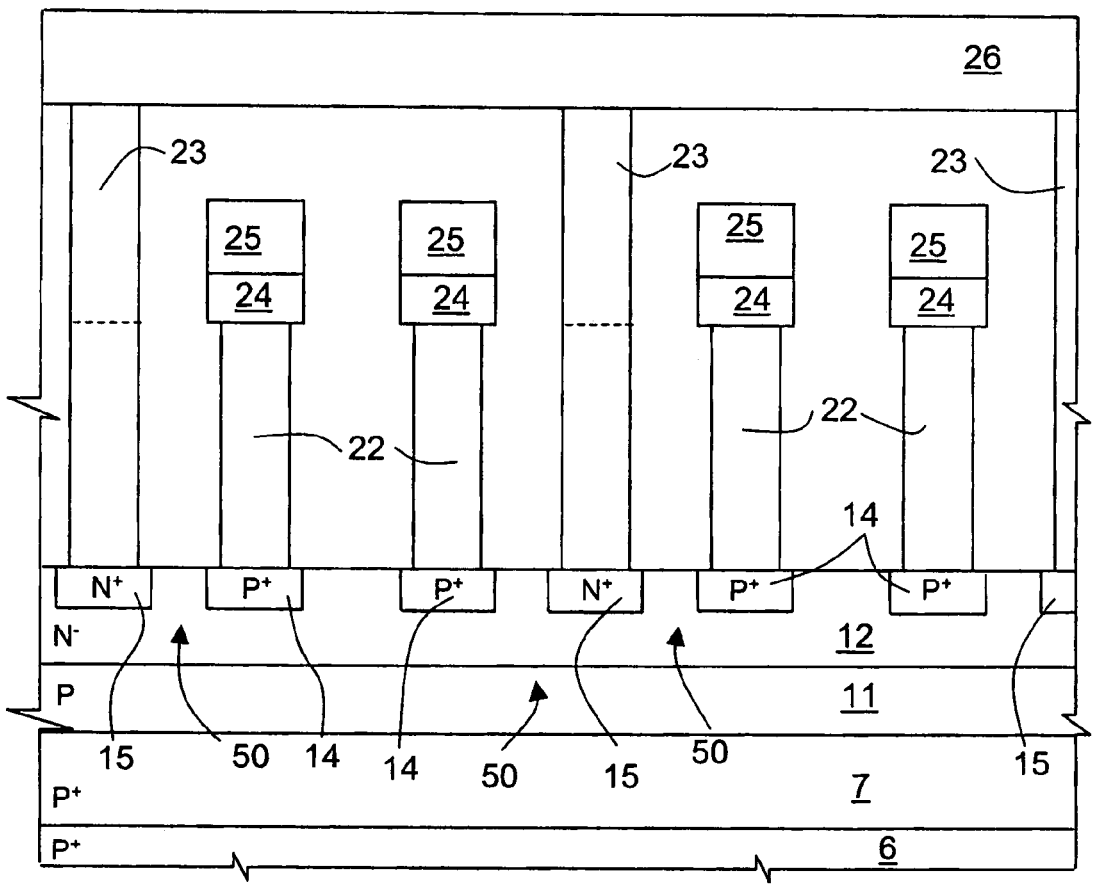
FIG. 16 is a cross-section of the third embodiment, taken along line XVI-XVI of FIG. 15.

FIGS. 15 and 16 show a third embodiment, wherein adjacent emitter regions 14 are not separated by other formations (base contacts or insulating material), but their electrical separation is only ensured by the intrinsic base region (active area strips 12).

Specifically, here the active areas are formed as active area strips 12, analogously to the embodiment of FIGS. 3-5; but each base contact region 15 is formed every two emitter regions 14, analogously to the embodiment of FIGS. 13 and 14. Thus, each base contact region 15 forms two bipolar transistors 50 with the adjacent emitter regions 14.

The mask used to obtain the structure of FIG. 16 are shown in FIG. 15: as may be noted, the active area mask 30 is the same as in FIG. 3 and the emitter mask 44 is the same as in FIG. 13.

The manufacturing process of the memory array of FIGS. 15 and 16 is the same described above with reference to FIGS. 3-5, with the only exception of the shape of the emitter mask 44, as above outlined.

In the embodiment of FIGS. 15 and 16, it is possible to further reduce the area occupation, depending on the minimum distance attainable between two adjacent emitter regions 14; however, the presence of lateral parasitic PNP bipolar transistors (formed by two adjacent emitter regions 14 and the intermediate portion of the respective active area strip 12) renders this embodiment applicable only to solution including design measure to reduce the resulting leakage current.

According to a different embodiment, more than two emitter regions 14, e.g., four, eight, etc., may be arranged between consecutive base contact regions 15 without an oxide or base isolation between them. In this case, the area occupation is still reduced, but the current leakage problem is worsened and base resistance could become a limiting factor for the emitters located farther from the base contact.

Some advantages of some embodiments of the present invention are the following.

The doping of the emitter regions 14 and base contact regions 15 through the openings formed in the dielectric layer 21 ensures self-alignment of these regions, and thus avoids the risk of short-circuit between them in case of mask misalignment.

The high doping of the subcollector 7 and its location directly on the substrate to connect the high doped common collector region 11 with the boron diffusing from the highly doped substrate 6 are very useful to reduce the voltage drop.

Also the high doping of the common collector region 11 ensures the latter to withstand a high current density, as is preferable for a selection element operating as a proper bipolar transistor; thereby effects due to high-level injection (such as Kirk effect) are prevented.

The given values for the base doping and the use of arsenic as a dopant ensure a good tradeoff among the various requirements, in particular as regards electrical insulation between adjacent wordlines, high gain, pinch-off and current leakages.

The implementation of a high gain bipolar transistor allows a reduction in the current flowing in the selected wordline, and thus a reduction in the area necessary to integrate the row decoders. The reduced wordline current reduces the voltage drop on the wordline, allowing a lower voltage operation as well as allows the implementation of longer wordlines, that is the possibility of selecting more bits with a single wordline, allowing for a more efficient memory area.

The reduced rowline current allows for less current density in minimum width wordlines, and thus an improved reliability.

Finally, it is clear that numerous variations and modifications may be made to the cell array as described and illustrated herein, all falling within the scope of the invention as defined in the attached claims.

E.g., it is possible to arrange multiple emitter regions 14 at each side of a base contact region 15 also in the embodiments of FIGS. 3-5 and 13-14, thus reducing the area occupation, while worsening current leakage due to parasitic components.

Furthermore, as indicated, the same array layout may be used for cells including a different storage component.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

The invention claimed is:

1. A process for manufacturing an array of cells, the process comprising:

providing a body of semiconductor material of a first conductivity type;

implanting, in said body, a common conduction region of said first conductivity type;

forming, in said body, above said common conduction region. a plurality of active area regions of a second conductivity type and a first doping level;

forming, on top of said body, an insulating layer having first and second openings after said first and second openings are formed, implanting first portions of said active area regions through said first openings with a dopant agent of said first conductivity type, thereby forming, in said active regions, second conduction regions of said first conductivity type;

after said first and second opening are formed, implanting second portions of said active area regions through said second openings with a doping agent of said second conductivity type, thereby forming control regions of said second conductivity type and a second doping level, higher than said first doping level, each said control contact region forming, together with said conduction region and said common conduction region, a selection bipolar transistor; and forming, on top of said body, a plurality of storage components, each storage component having a terminal connected to a respective second conduction region and defining, together with said bipolar transistor, a cell of said cell array.

2. The process according to claim 1 wherein said step of forming a plurality of active area regions includes:

forming insulating regions in said body, said insulating regions surrounding said active area regions; and implanting arsenic in said active area regions.

3. The process according to claim 2 wherein said implanting arsenic includes implanting at an energy of 150-300 keV, so that said first doping level is between $5*10^{17}$ and $5*10^{18}$ atoms/cm$^3$.

4. The process according to claim 1 wherein said providing the body includes growing an epitaxial layer of said first conductivity type and another doping level on a substrate of said first conductivity type and a fourth doping level higher than said third doping level, the process further comprising, before said forming a plurality of active area regions:

in said expitaxial layer on top of said substrate, implanting a subcollector region of said first conductivity type and a fifth doping level, higher than said third doping level; and in said expitaxial layer on top of said subcollector region, implanting said common conduction region so that said common conduction region has a sixth doping level, higher than said third doping level and lower than said fifth doping level.

5. The process according to claim 4 wherein said implanting the subcollector region includes implanting $10^{13}$ to $10^{14}$ atoms/cm$^3$ and said fifth doping level is between $10^{17}$ and $10^{19}$ atoms/cm$^3$.

6. The process according to claim 4 wherein said subcollector region is arranged at a depth between 400-800 nm.

7. The process according to claim 4 wherein said sixth doping level is between $10^{17}$ and $10^{19}$ atoms/cm$^3$.

8. The process according to claim 7 wherein said subcollector region is arranged at a depth between 200 and 400 nm from a surface of said body.

9. The process according to claim 1 wherein said step of implanting second portions of said active area regions comprises implanting boron at an energy of approximately 1 KeV.

10. The process according to claim 9 wherein said second conduction regions extend from a surface of said body to a depth of about 50 nm and have a doping level between $10^{18}$ and $10^{20}$ atoms/cm$^3$.

11. A process for manufacturing a cell array, the process comprising:
forming a plurality of cells each including a selection bipolar transistor and a storage component, each selection bipolar transistor having a first, a second and a control region, and each storage component having a first and a second terminal, said first region of each bipolar transistor being coupled to said first terminal of a respective one of the storage components, said plurality of cells being formed by:
implanting in a semiconductor body a common conduction region of a first conductivity type, the common conduction region including said second regions of said selection bipolar transistors, said semiconductor body including a substrate extending below said common conduction region and having said first conductivity type and a third doping level, said semiconductor body further including a subcollector region extending between said substrate and said common conduction region, said subcollector region said first conductivity type and a doping level higher than said common conduction region wherein said subcollector region has a do in level between $10^{18}$ and $10^{19}$ atoms/cm$^3$;
forming a plurality of active area regions of a second conductivity type and a first doping level, overlying said common conduction region and including said control regions of said selection bipolar transistors;
forming a plurality of second conduction regions of said first conductivity type in said active area regions, the second conduction regions being said first regions of said selection bipolar transistors; and
forming a plurality of control contact regions of said second conductivity type and a second doping level, higher than said first doping level, in said active area regions.

12. The process according to claim 11 wherein said bipolar transistor is of PNP type, said common region is a collector region, said second conduction regions are emitters of said bipolar transistors.

13. The process according to claim 12 wherein forming said active area regions includes doping with arsenic a portion of the semiconductor body above the common conduction region and wherein said first doping level of said active area regions is between $5*10^{17}$ and $5*10^{18}$ atoms/cm$^3$.

14. The process according to claim 11 wherein said second conduction regions have a doping level of about $10^{19}$ and $10^{20}$ atoms/cm$^3$.

15. The process according to claim 11 wherein each storage component is a phase change memory element.

16. A process for manufacturing a cell array, the process comprising:
forming a plurality of cells each including a selection bipolar transistor and a storage component, each selection bipolar transistor having a first, a second and a control region, and each storage component having a first and a second terminal, said first region of each bipolar transistor being coupled to said first terminal of a respective one of the storage components, said plurality of cells being formed by:
implanting in a semiconductor body a common conduction re ion of a first conductivity type, the common conduction region including said second regions of said selection bipolar transistors, said semiconductor body including a substrate extending below said common conduction re ion and having said first conductivity type and a third doping level, said semiconductor body further including a subcollector region extending between said substrate and said common conduction region, said subcollector region having said first conductivity type and a doping level higher than said common conduction region;
forming a plurality of active area regions of a second conductivity type and a first doping level, overlying said common conduction region and including said control regions of said selection bipolar transistors;
forming a plurality of second conduction regions of said first conductivity type in said active area regions, the second conduction re ions hem said first regions of said selection bipolar transistors; and
forming a plurality of control contact regions of said second conductivity type and a second doping level, higher than said first doping level, in said active area regions wherein said common conduction region has a doping level between $10^{17}$ and $10^{18}$ atoms/cm$^3$.

17. A process of manufacturing a memory device, the process comprising:
forming a semiconductor body of a first conductivity type;
forming a storage component having first and second terminals; and
forming a selection bipolar transistor having a first conduction region, a second conduction region, and a base region, the first conduction region of the bipolar transistor being coupled to the first terminal of the storage component, wherein said forming the bipolar transistor includes:
forming, in the semiconductor body, the second conduction region of the bipolar transistor;
overlying the second conduction region with a first active region of a second conductivity type, the first active region being the base region of the bipolar transistor;
forming in the first active region a first base contact region of the second conductivity type and a doping level that is higher than a doping level of the first active region;
forming in the active region the first conduction region of the first conductivity type, the first conduction region being surrounded by the first active region and being spaced laterally apart from the base contact region by a first portion of the active region; and
forming a first conductive contact on the first conduction region and coupled between the first conduction region and the storage component, wherein said forming the semiconductor body includes:
providing a semiconductor substrate having the first conductivity type;
forming a common conduction region immediately below the first active region and having a first conductivity type; and
forming a subcollector region extending between the substrate and the common conduction region, the subcollector region having the first conductivity type and a doping level higher than a doping level of the common conduction region wherein the subcollector region has a doping level between $10^{18}$ and $10^{19}$ atoms/cm$^3$ and the common conduction region has a doping level between $10^{17}$ and $10^{18}$ atoms/cm$^3$.

18. The process of claim 17 wherein the storage component is a phase change memory element.

19. A process for manufacturing a cell array, the process comprising:
   growing an epitaxial layer of a first conductivity type and a first doping level on a semiconductor substrate of said first conductivity type and a second doping level higher than said first doping level;
   implanting, in said substrate, a common conduction region of said first conductivity type;
   implanting, in said epitaxial layer on top of said substrate, a subcollector region of said conduction type and a third doping level higher than said first doping level;
   implanting, in said expitaxial layer on top of said subcollector region, said common conduction region so that said common conduction region has a fourth doping level higher than said third doping level and lower than said third doping level;
   forming, in said substrate, above said common conduction region, a plurality of active area regions of a second conductivity type and a fifth doping level;
   forming, in the first portions of said active area regions, second conduction regions of said first conduction type;
   forming, in second portions of said active area regions, control contact regions of said second conductivity type and a sixth doping level higher than said fifth doping level, each of said control contact regions forming a selection bipolar transistor together with said second conduction region and said common conduction region; and
   forming, on the top of said substrate, a plurality of storage components, each storage component having a terminal connected to a respective second conduction region and defining a cell of said cell array together with said bipolar transistor.

20. The process of claim 19 wherein, before or after said forming said second conduction regions, patterned enriched regions having said second conductivity type are formed to extend below said second conduction regions, said enriched regions having a seventh doping level higher than said firth doping level.

21. The process of claim 19 wherein forming said plurality of active area regions includes:
   forming insulating regions in said substrate, said insulating regions surrounding said active area regions; and
   implanting arsenic in said active regions.

22. A process for manufacturing a memory device, the process comprising:
   forming a semiconductor body, the semiconductor body having a semiconductor substrate of a first conductivity type;
   forming a storage component;
   forming in the semiconductor body of a first conduction region of a bipolar selection transistor;
   overlying the first conduction region with an active region of a second conductivity type, the active region being a base region of the bipolar selection transistor;
   forming in the active region a base contact region of the second conductivity type and a doping level higher than the doping level of the active region;
   forming in the active region a second conduction region of the bipolar selection transistor, the second conduction region being of the first conductivity type, the second conduction region being surrounded by the first active region and spaced laterally apart from the base contact region by a portion of the active region;
   forming a first conductive contact on the second conduction region and coupled between the first conduction region and the storage component;
   forming a common conduction region immediately below the first active region, the common conduction region being of the first conductivity type; and
   forming a subcollector region extending between the substrate and the common conduction region, the subcollector being of the first conductivity type and a doping level higher than a doping level of the common region wherein the subcollector region has a doping level between $10^{18}$ and $10^{19}$ atoms/cm$^3$ and the common conduction region has a doping level between $10^{17}$ and $10^{18}$ atoms/cm$^3$.

23. The process of claim 22 wherein the storage component includes a phase change memory element.

* * * * *